United States Patent [19]

Morales

[11] Patent Number: 4,555,642
[45] Date of Patent: Nov. 26, 1985

[54] LOW POWER CMOS INPUT BUFFER CIRCUIT

[75] Inventor: Louis J. Morales, Nesconset, N.Y.

[73] Assignee: Standard Microsystems Corporation, Hauppauge, N.Y.

[21] Appl. No.: 534,783

[22] Filed: Sep. 22, 1983

[51] Int. Cl.[4] ............... H03K 19/01; H03K 19/017; H03K 19/092

[52] U.S. Cl. .................................. 307/475; 307/585; 307/297; 323/316

[58] Field of Search ............ 307/443, 475, 297, 446, 307/451, 579, 585; 323/315, 316

[56] References Cited

U.S. PATENT DOCUMENTS

| | | | |
|---|---|---|---|
| 4,242,604 | 12/1980 | Smith | 307/443 |
| 4,469,959 | 9/1984 | Luke et al. | 307/451 X |
| 4,471,242 | 9/1984 | Noufer | 307/297 X |
| 4,473,762 | 9/1984 | Iwahashi et al. | 307/297 X |
| 4,475,050 | 10/1984 | Noufer | 307/475 |

*Primary Examiner*—Larry N. Anagnos
*Attorney, Agent, or Firm*—Hopgood, Calimafde, Kalil, Blaustein & Judlowe

[57] ABSTRACT

A buffer input circuit, such as for use with a TTL level input, includes an additional or dummy input buffer stage in which the MOS devices are scaled and configured as in a real input buffer stage. The current produced in the dummy input buffer stage for an input voltage at a preset minimum high level is sensed and converted to a compensation voltage, which is applied to the real buffer stages, thereby to modify the current in the real buffer stages to a desired minimum level.

9 Claims, 3 Drawing Figures

LOW POWER CMOS INPUT BUFFER CIRCUIT

The present invention relates generally to CMOS circuits, and more particularly to an improved high-speed CMOS input buffer circuit.

An input buffer circuit is commonly employed to match the output levels of a TTL circuit to the input levels needed to operate a CMOS logic circuit. Typically a TTL level input is at 0.8 volt for a logic "0" and 2.0 volt for a logic "1", whereas a CMOS logic circuit typically employs a 1.5 volt signal as a logic "0" and a 3.5 volt signal as a logic "1".

The conventional buffer circuit includes a CMOS inverter stage, which includes a p-channel FET device connected in series with an n-channel device between a source voltage Vcc and ground. The TTL input is applied to the gates of both of these devices. In the conventional CMOS inverter, the p-channel device is caused to conduct when the difference between the Vcc voltage supply and the TTL input high level (Vih, typically 2.0 volt) is greater than the device's threshold voltage.

One major goal in the design of a CMOS input buffer is to achieve a reduced current flow through the p-channel device so as to minimize the amount of power dissipated. One approach that has been proposed to reduce the current drawn in a CMOS input buffer involves the use of a feedback path, which includes an inverter and an addition p-channel device, between the inverter output and the source of the input inverter p-channel device. As described in greater detail in a later part of this specification, the source voltage at the input inverter p-channel device is established by the operation of the feedback path at a level that causes the input p-channel device to draw an optimally low current at the TTL high input level.

Although this circuit has been found to be effective in reducing the current in the input buffer stage to an acceptably low value, the delay caused by the feedback path significantly reduces the speed of operation of the circuit, thereby making it unsuitable for applications if high speed of operation is required. In addition, this circuit requires that certain of the MOS devices, including the input p-channel device, be relatively large in size, which increases the circuit capacitance, thereby creating a further deleterious effect on the operating speed of the circuit. Further, attempts to increase the operating speed of the feedback path by further increasing device sizes will have the opposite effect of reducing operating speeds as a result of the increased capacitance of those devices. Still further, processing variations in the p-channel and n-channel threshold voltages (Vthn and Vthp) make it difficult for the designer to size the MOS devices, which creates the requirement for the relatively large sizes of these devices.

With the present design alternatives now available, the designer of a CMOS input buffer circuit must thus make a selection of either high operating speed at a high current drain, or a low current drain at low operating speeds. That is, in the known CMOS input buffers high operating speed is achieved at the expense of high power or high current drain. A need thus exists for a CMOS input buffer which provided both low current drain and high speed of operation.

It is accordingly an object of the present invention to provide a TTL-compatible CMOS input buffer that avoids the drawbacks of the known CMOS input buffers.

It is a further and more particular object of the present invention to provide a TTL-compatible CMOS input buffer that operates at high speed and at an optimally minimum amount of current.

To these ends, the present invention provides an improved low-power and high-speed CMOS input buffer which includes a "dummy" or additional input buffer stage in which the CMOS FETs are scaled to the same size ratios as the corresponding devices in the real input buffer stages which make up the input buffer. An input voltage corresponding to Vih is continuously applied to the dummy input buffer stage. The current flowing through the dummy input buffer stage as a result of the application of the simulated input Vih signal is sensed and compared to a preset current level to produce a control or compensation voltage which is applied to each of the real input buffer stages. The compensation voltage is effective to control the operation of the p-channel devices of the real input buffer stages so that each of the input buffer stages operates at a minimum or optimally low current when Vih is applied to their inputs.

To the accomplishment of the foregoing and such further objects that may hereinafter appear, the present invention relates to a CMOS input buffer circuit substantially as defined in the appended claims, and as described in the following specification of an embodiment thereof as considered with the accompanying drawings in which:

Figure 1:
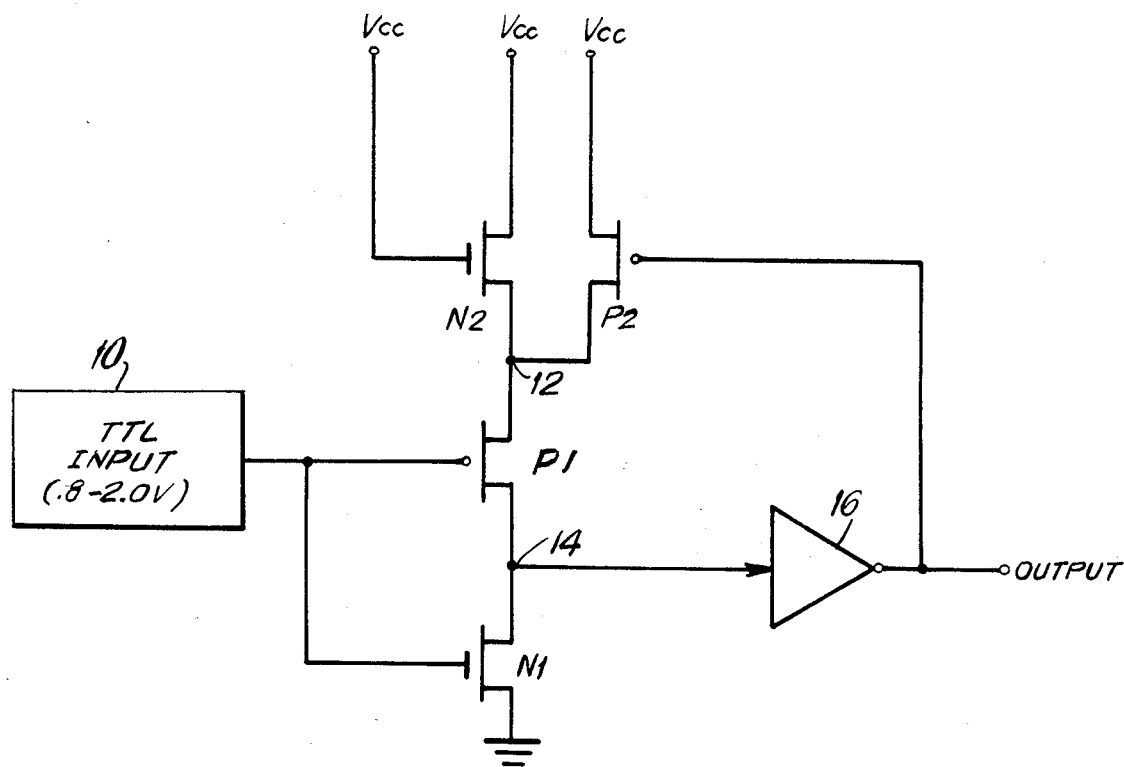
FIG. 1 is a schematic diagram of a prior art CMOS input buffer circuit over which the CMOS input buffer circuit of the present invention is an improvement.

The prior art CMOS input buffer circuit illustrated in FIG. 1 has a TTL input 10 at a level of either 0.8 volt ("0") or 2.0 volt ("1") applied to the gates of a p-channel MOS FET or device P1 and an n-channel MOS device N1. The source of device P1 is connected to the source of an n-channel device N2 and to the drain of a p-channel device P2 at a node 12. The gate and drain of device N2 and the source of device P2 are connected to a supply voltage Vcc (typically 5 volt).

The source of device N1 is connected to ground and its drain is connected to the drain of device P1 at a node 14. The latter is, in turn, connected to the input of an inverter 16, the output of which is connected to the gate of device P2. The output of inverter 16 is also the output of the input buffer circuit.

In the operation of the prior art circuit of FIG. 1, when the input is at the low level (0.8 v), device P1 is on and device N1 is off causing the voltage at node 14 to approach the level at node 12 of (Vcc-Vth) or about 3.5 volts. The voltage at node 14 is inverted in inverter 16 and applied as a relatively low voltage (in the order of 2.0 volts) to the gate of device P2 causing the latter to conduct, thereby increasing the voltage at node 12 toward Vcc or about 5.0 volts since device N1 is essentially off at this time. This, in turn, causes the voltage at the output of inverter 16 to approach 0 volts, which is the desired buffer output level for a low TTL input of 0.8 volts.

For an TTL input at the high (Vih) level of 2.0 volts, device P1 remains on, but at this time device N1 is also turned on thereby to connect node 14 to ground. This will cause the voltage at node 14 to decrease to typically 2 volts depending on the relative sizes of devices P1 and N1 which, in turn, causes the output of inverter 16 to increase to about 3 volts. That voltage applied to the gate of device P2 tends to render device P2 nonconductive, which, in turn, causes the voltage at node 12 to be reduced to about 4 volts. This, in turn, causes device P1 to be less conductive which further decreases the voltage at node 14.

This process is repeated until the voltage at node 12 is reduced to a level at which device P1 is off or minimally conducting, and the buffer output is about 5.0 volts as is desired for a high (Vih) TTL input. Thus, the goal of drawing minimum current at a Vih input is satisfied by the prior art input buffer of FIG. 1. However, the feedback through inverter 16 and device P2 introduces a delay in the circuit operation which undesirably reduces its operating speed. Moreover, the relatively large sizes required for devices P1 and N2, as a result of processing variations of the n- and p-channel threshold voltages, further create added capacitance and reduce the circuit device density both of which are additional drawbacks of the input buffer circuit of FIG. 1.

Figure 2:
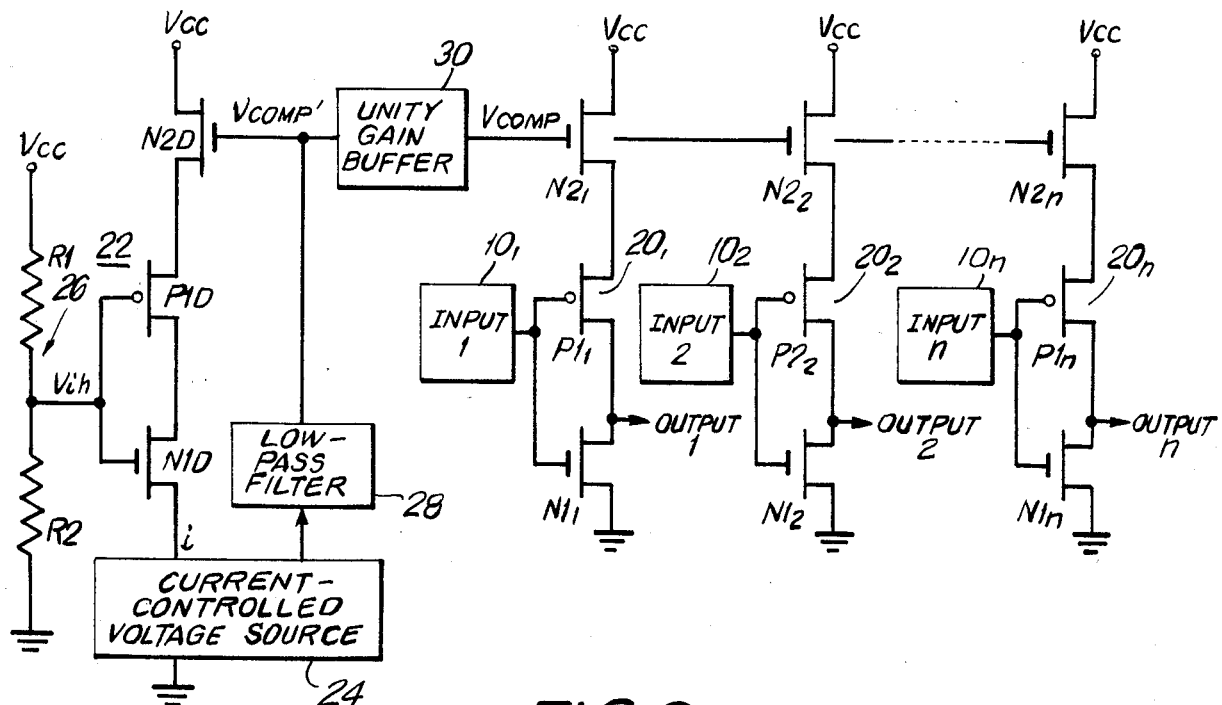
FIG. 2 is a schematic diagram, partly in block form, of an embodiment of the CMOS input buffer circuit of the invention.
Figure 3:
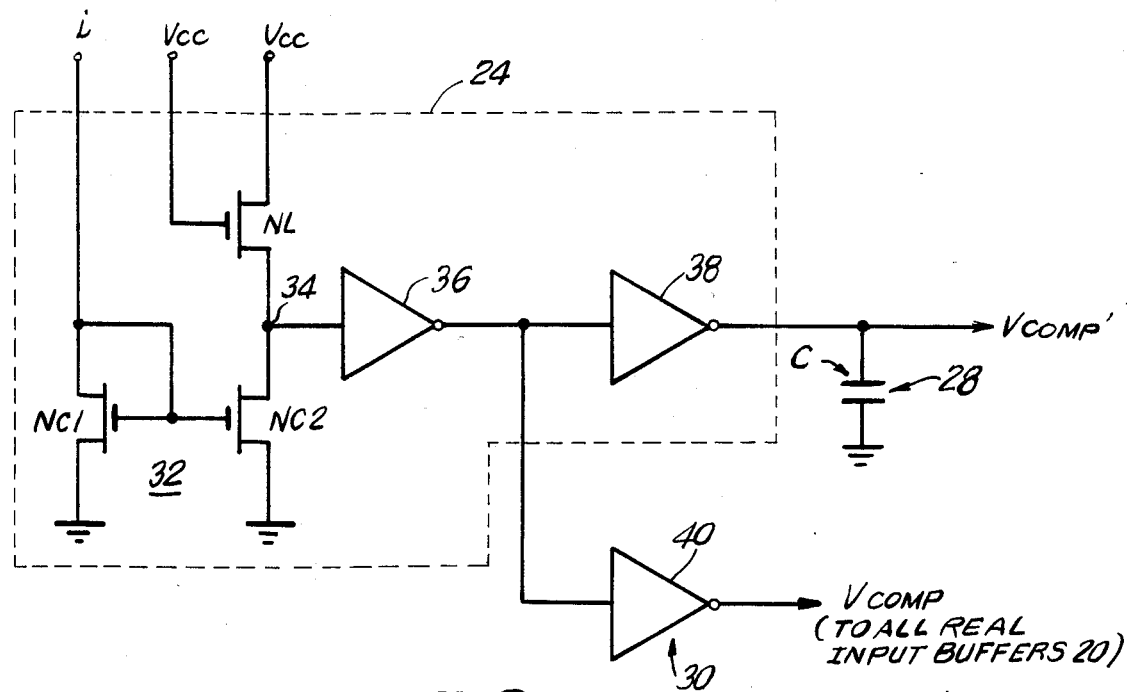
FIG. 3 is a more detailed schematic diagram of portions of the input buffer circuit of FIG. 2.

These drawbacks are eliminated in the CMOS input buffer circuit of the present invention, an embodiment of which is illustrated schematically in FIGS. 2 and 3. As therein shown, the input buffer circuit of the invention includes a plurality of real buffer stages $20_1$, $20_2$ ... $20_n$ and a dummy or additional input stage 22. The real buffer stages respectively receive TTL inputs $10_1$, $10_2$ ... $10_n$, and each includes n- and p-MOS devices N2, P1 and N1 arranged in a manner similar to their arrangement in the prior art buffer circuit of FIG. 1, with the significant difference in the signal applied to the gate of the upper device N2 in each of the real buffer stages 20, as described in greater detail in a later part of this specification.

The dummy input buffer 22 includes a similar configuration of n and p devices N1D, P1D, and N2D connected between Vcc and the current input of a current-controlled voltage source 24, described in greater detail below with reference to FIG. 3. The input applied to the gates of devices P1D and N1D is a dc voltage at the Vih level, to wit 2 volts, derived from a voltage divider 26 consisting of resistors R1 and R2 connected between Vcc and ground.

The voltage output of voltage source 24 is passed through a low-pass filter 28 to produce a voltage Vcomp'. The latter is applied to the gate of device N2D and to an input of a unity gain buffer 30. The output of buffer 30 is the control or compensating voltage Vcomp, which, as shown in FIG. 2, is applied to the gates of the upper n-channel devices $N2_1$, $N2_2$ ... $N2_n$ for each real input buffer $20_1$, $20_2$ ... $20_n$ to minimize the current drawn in each real input buffer of TTL inputs in a manner described below.

The current-controlled voltage source 24, as illustrated in FIG. 3, includes a current mirror or comparator 32 comprising n-channel MOS devices NC1 and NC2 and a load device NL, the latter being connected to the drain of device NC2 at a node 34. Node 34 is connected to an input of an inverter 36, the output of which is connected to an input of a second inverter 38. The output of the inverter 36 is also applied to an input of inverter 40, which constitutes the unity gain buffer 30. The output of inverter 38 is applied through a capacitor C, which constitutes the low-pass filter 28. The output across capacitor C is the voltage Vcomp', whereas the output of inverter 40 is the voltage Vcomp applied to each of the real input buffer stages 20.

In operation, the application of a fixed voltage Vih to the gates of devices P1D and N1D causes current to flow through these devices. That current flow is compared in the current-controlled voltage source 24 against a present minimum desired current in a manner to be described below, so as to produce a correction or error voltage proportional to the difference between these currents. That voltage is applied to the low-pass filter 28 to the gate of device N2D, thereby to vary the source voltage at device P1D. This, in turn, varies the current drawn by device P1D, which, in turn, varies the error voltage applied to device N2D.

As a result of this feedback operation a voltage Vcomp' is established at the gate of device N2D, which, in turn, establishes a voltage at the source of devices P1D, which, for a voltage at a level Vih applied to its gate, draws a preset minimum current. The provision of the low-pass filter 28 in this feedback path prevents oscillation.

The voltage Vcomp' is also applied through the unity-gain buffer 30 as a voltage Vcomp to the gates of the upper devices, $N2_1$, $N2_2$ ... $N2_n$ in each of the real buffer stages 20. Since the size ratios of the devices N2D, P1D and N1D in the dummy input buffer 22 are the same as the size ratios of the corresponding devices in the real input buffer stages 20, the source voltages established by the N2 device at the P1 device for each real buffer stage will cause the current drawn in each of the real buffer stages to be at or near the preset minimum current value established by the operation of the dummy buffer stage, as is desired for optimum circuit operation.

The current-controlled voltage source 24 shown in FIG. 3 operates as follows. The minimum preset or reference current, which may typically be 100 μa, is set by the size of the load device NL, which acts as a current source to supply current to device NC2. The current i drawn by the dummy input buffer is applied to the drain of device NC1 and to the gates of devices NC1 and NC2.

Since devices NC1 and NC2 are in saturation they will conduct the same amount of current. Thus, when the current i is greater then the reference current, the voltage at node 34 is low since device NC2 is pulling more current than current source device NL can deliver. The output of inverter 36 is thus high so that Vcomp', the output of inverter 38, is low. That voltage, as noted previously, varies the voltage at the source of device P1D in the dummy input buuffer so as to decrease the current i drawn by that device toward the minimum reference current.

When the current i drawn in the dummy input buffer is less than the reference current, the voltage at node 34 is high as is the voltage Vcomp', which, when applied to the gate of device N2D, varies the voltage at the source of device P1D, thereby to increase the current i toward the amount of the reference current. In this manner, the current i is established at an amount that is essentially equal to the minimum reference current. Because there is little current flowing through the dummy input buffer, the voltage Vcomp' is approximately equal to Vih+Vtp and Vtn (the p and n threshold voltages). The latter sum will be close to Vcc, assuming a 5 volt supply; therefore little power will be dissipated if inverter 38 is a regular CMOS inverter. For the same reason inverter 36 will be close to ground voltage and can be a standard inverter. If this assumption is not true, resistive load type inverters could be used for inverters 36 and 38. The amount of current that the designer finds acceptable for input buffer leakage is set via the size of device NL and/or the ratio between devices NC1 and NC2.

It will thus be appreciated that the CMOS input buffer circuit of the present invention provides high-speed input buffer operation while, at the same time, ensuring operation at a minimum current and thus a minimum amount of power dissipation. If desired, the device N1D may be omitted from the dummy buffer stage 22, should that device be found to place the current mirror device NC1 in the current-controlled voltage source 24 out of saturation or "off". It will thus be appreciated that this and possibly other modifications to the embodiment of the invention hereinabove specifically described may be made by those having ordinary skill in the art without necessarily departing from the spirit and scope of the invention.

What is claimed is:

1. An input buffer circuit comprising at least one buffer stage having an input for receiving a signal at one of two logical levels, an output, a first switching device connected between said input and said output, and a first control device connected to said first switching device; and an additional dummy input buffer stage having a second switching device and a second control device connected to said second switching device, said control devices and said switching devices are respectively complementary MOS devices means for applying an input signal at one of said logic levels to said second switching device to cause said second switching device to be conductive, and sensing means coupled to said second switching device and wherein said sensing means includes a source of a reference current operatively coupled to said first control device for comparing the current from said second switching device against said reference current and for producing a control signal responsive to that comparison; and means for applying said control signal to said second control device and to said first control device in said one buffer stage to tend to minimize the current in said first switching device.

2. The input buffer circuit of claim 1, in which said input signal applied to said second switching device is a dc voltage at a level corresponding to one of the levels applied to said first switching device.

3. The input buffer circuit of claim 2, in which said sensing means includes means for producing a voltage corresponding to the difference between said reference current and the current in said second switching device.

4. The input buffer circuit of claim 3, in which said control signal applying means further comprises means for applying said control signal to the control terminal of said second control device in said dummy buffer stage.

5. The input buffer circuit of claim 4, in which said control signal applying means comprises a low-pass filter interposed between said sensing means and the control terminal of said first and second control devices.

6. The input buffer circuit of claim 2, in which the size ratio of said first switching device and said first control device is substantially equal to the size ratio of said second switching device and said second control device.

7. A CMOS input buffer circuit comprising a plurality of buffer stages each having a switching device receiving a binary input signal at one of two levels and a control device connected to said switching device, and an additional dummy buffer stage including a dummy switching device and a dummy control device connected to said dummy switching device said control devices and said switching devices are respectively complementary MOS devices; means for applying a dc input to the control terminal of said dummy switching device at one of said input levels so as to render said dummy switching device conductive, sensing means including a source of a reference current connected to said dummy switching device for sensing the current drawn by said conductive dummy switching device and for producing a corresponding control signal, and means for applying said control signal to the control terminal of said dummy control device and to the control terminals of said control devices in each of said buffer stages, thereby to maintain at a preset level the current drawn by said switching devices in said buffer stages.

8. The input buffer of claim 7, in which said sensing means further includes means for comparing said reference current and the current drawn by said dummy switching device.

9. The input buffer of claim 7, in which the size ratio of said dummy switching device and said dummy control device is substantially equal to the size ratio of said switching device and said control device in each of said buffer stages.

* * * * *